(12) United States Patent
Tsai et al.

(10) Patent No.: US 8,709,570 B2
(45) Date of Patent: Apr. 29, 2014

(54) NEAR-FIELD OPTICAL DISK HAVING SURFACE PLASMON AMPLIFICATION BY STIMULATED EMISSION OF RADIATION

(75) Inventors: Din-Ping Tsai, Taipei (TW); Chiun-Da Shiue, Taipei (TW); Shih-Chiang Yen, Taipei (TW)

(73) Assignee: National Taiwan University, Taipei (TW)

( * ) Notice: Subject to any disclaimer, the term of this patent is extended or adjusted under 35 U.S.C. 154(b) by 707 days.

(21) Appl. No.: 12/944,319

(22) Filed: Nov. 11, 2010

(65) Prior Publication Data

US 2011/0209165 A1    Aug. 25, 2011

(30) Foreign Application Priority Data

Feb. 22, 2010 (TW) ................................ 99104991 A

(51) Int. Cl.
*G11B 7/24* (2013.01)

(52) U.S. Cl.
USPC ................. 428/64.1; 428/64.4; 430/270.13

(58) Field of Classification Search
USPC ...................... 428/64.4; 430/270.13
See application file for complete search history.

(56) References Cited

U.S. PATENT DOCUMENTS 6,896,946 B2 * 5/2005 Chen ........................... 428/64.1

\* cited by examiner

*Primary Examiner* — Elizabeth Mulvaney
(74) *Attorney, Agent, or Firm* — Edwards Wildman Palmer LLP; Peter F. Corless; Steven M. Jensen

(57) ABSTRACT

A near-field optical disk having surface plasmon amplification by stimulated emission of radiation (SPASER) is provided. The near-field optical disk having SPASER includes a transparent substrate, a first transparent dielectric thin film layer formed on the transparent substrate, a SPASER thin film layer formed on the first transparent dielectric thin film layer, a second transparent dielectric thin film layer formed on the SPASER thin film layer, a recording thin film layer formed on the second transparent dielectric thin film layer, and a third transparent dielectric thin film layer formed on the recording thin film layer.

18 Claims, 6 Drawing Sheets

NEAR-FIELD OPTICAL DISK HAVING SURFACE PLASMON AMPLIFICATION BY STIMULATED EMISSION OF RADIATION

CROSS-REFERENCES TO RELATED APPLICATIONS

This application claims under 35 U.S.C. §119(a) the benefit of Taiwanese Application No. 99104991 filed Feb. 22, 2010 the entire contents of which is incorporated herein by reference.

FIELD OF THE INVENTION

The present invention relates to near-field optical disks, and more particularly to a near-field optical disk having surface plasmon amplification by stimulated emission of radiation (SPASER) generated by a three-layered structure composed of a metal thin film layer, an insulating thin film layer and a gain thin film layer.

BACKGROUND OF THE INVENTION

With never-ending changes and improvement of the technologic development, the manufacturing technologies of visual-audio compression and laser electro-optical products become more matured than ever before. Optical storage media have developed toward the objectives of smaller size and larger storage capacity step by step. And, since the advantages of optical disks have larger in storage capacity, lower in cost, easier to saving, longer in storage period and uneasy in information damaged and so on, the optical disks have been one of essential saving medias already in our modern society.

In 1980, Philips Company proposed a recording medium having a transparent substrate and a plurality of data pits, and accessed by irradiating a laser beam through the transparent substrate. To meet the needs of a variety of data storage applications, various types of compact disk (CD), for example, CD, CD-G; CD-I, photo-CD, VCD, CD-R and CD-RW, have been suggested and realized. In 1995, due to the increasing demand for larger amount of information, a high storage capacity optical disk, digital versatile disk (DVD), is proposed to provide 4.7 GB data on a single layer disk with a diameter of 12 cm. Next, a new generation of Blu-ray disk also published in 2002 by SONY. Recently, the largest storage capacity of Blu-ray disk with a single layer has achieved to 25 GB.

On the other hand, with the popularity of 3D films, 3D televisions and fiber optic networks, the requirements of a better quality of videos and of a larger storage capacity of saving media are increased. In the past, the following methods were used to increase the storage capacity of the conventional optical disks: (1) a more efficient coding and decoding technique, (2) a small size of all the pits and their pitches of the tracks on optical disks, (3) using the shorter wavelength of a light source, (4) increase of the numerical aperture value of the objective lens, (5) using a volumetric technology such as multi-layer recording, holography, etc. However, aforementioned methods are only the optimizations under the diffraction limit. Basically, the access and write data pits of the optical disk are still restricted by diffraction limit. Therefore, it is difficult to achieve a major breakthrough to increase the storage capacity of the optical disks in the prior art.

SUMMARY OF THE INVENTION

In light of the drawbacks of the aforementioned prior art, the present invention provides a near-field optical disk having surface plasmon amplification by stimulated emission of radiation (SPASER) such that the problem of storage capacity of the optical disks restricted by diffraction limit in the prior art can be resolved.

To achieve the aforementioned and other objectives, a near-field optical disk having SPASER is provided, which comprises: a transparent substrate, a first transparent dielectric thin film layer formed on the transparent substrate, a SPASER thin film layer formed on the first transparent dielectric thin film layer, a second transparent dielectric thin film layer formed on the SPASER thin film layer, a recording thin film layer formed on the second transparent dielectric thin film layer, and a third transparent dielectric thin film layer formed on the recording thin film layer.

In one embodiment of the present invention, the SPASER thin film layer comprises a metal thin film layer in contact with the first transparent dielectric thin film layer, an insulating thin film layer formed on the metal thin film layer, and a gain thin film layer formed on the insulating thin film layer and in contact with the second transparent dielectric thin film layer.

In another embodiment of the present invention, the SPASER thin film layer comprises a gain thin film layer in contact with the first transparent dielectric thin film layer, an insulating thin film layer formed on the gain thin film layer, and a metal thin film layer formed on the insulating thin film layer and in contact with the second transparent dielectric thin film layer.

In an embodiment of the present invention, the metal thin film layer is made of a material selected from the group consisting of gold (Au), silver (Ag), platinum (Pt), palladium (Pd), tin (Sn), cadmium (Cd), lead (Pb), copper (Cu), gallium (Ga), germanium (Ge), arsenic (As), selenium (Se), indium (In), antimony (Sb), and tellurium (Te), a metal oxide thereof, a metal sulfide thereof, and a metal nitride thereof. Further, the metal thin film layer ranges from about 1 nm to 15 nm in thickness.

In another embodiment of the present invention, the insulating thin film layer is made of a material selected from the group consisting of zinc sulfide-silicon oxide (ZnS—SiOx), silicon oxide (SiOx), silicon nitride (SiNx), germanium nitride (GeNx), aluminum nitride (AlNx), titanium nitride (TiNx) and silver oxide (AgOx). Herein, the insulating thin film layer is less than 4 nm thick.

In an embodiment of the present invention, the gain thin film layer is made of zinc oxide (ZnO), and is 40 nm thick.

In an embodiment of the present invention, the transparent substrate is made of polycarbonate or epoxy resin, and a side surface of the transparent substrate is formed with a plurality of tracks.

In an embodiment of the present invention, the first transparent dielectric thin film layer is made of a material selected from the group consisting of ZnS—SiOx, SiOx, SiNx, GeNx, AlNx, TiNx and AgOx. The first transparent dielectric thin film layer ranges from 80 nm and 200 nm in thickness.

In an embodiment of the present invention, the second transparent dielectric thin film layer is made of ZnS—SiOx, SiOx or SiNx, and ranges from about 10 nm to 20 nm in thickness.

In one embodiment of the present invention, the recording thin film layer is made of an alloy of Ge, Sb and Te, or an alloy of Ag, In, Sb and Te. In addition, the recording thin film layer is made of a material selected from the group consisting of Ag, Au, Cu, In, Sb, Te, Ga, As, Sn, Zn, Ce, Ge and Al. Herein, the recording thin film layer ranges from about 10 nm to 30 nm in thickness.

In an embodiment of the present invention, the third transparent dielectric thin film layer is made of a material selected from the group consisting of zinc sulfide-silicon oxide ZnS—SiOx, SiOx, SiNx, GeNx, AlNx, TiNx and AgOx, and ranges from about 20 nm to 40 nm in thickness.

In an embodiment of the present invention, the near-field optical disk further comprises a protective layer formed on the third transparent dielectric thin film layer and in contact with the third transparent dielectric thin film layer. The protective layer is made of polycarbonate or epoxy resin.

It is another object of the present invention to provide a near-field optical disk having SPASER, which comprises: a transparent substrate, a first transparent dielectric thin film layer formed on the transparent substrate, a recording thin film layer formed on the first transparent dielectric thin film layer, a second transparent dielectric thin film layer formed on the recording thin film layer and a SPASER thin film layer formed on the second transparent dielectric thin film layer.

In one embodiment of the present invention, the SPASER thin film layer includes a metal thin film layer in contact with the first transparent dielectric thin film layer, an insulating thin film layer formed on the metal thin film layer, and a gain thin film layer formed on the insulating thin film layer.

In an embodiment of the present invention, the SPASER thin film layer comprises a gain thin film layer in contact with the first transparent dielectric thin film layer, an insulating thin film layer formed on the gain thin film layer, and a metal thin film layer formed on the insulating thin film layer.

In an embodiment of the present invention, the metal thin film layer is made of a material selected from the group consisting of Au, Ag, Pt, Pd, Sn, Cd, Pb, Cu, Ga, Ge, As, Se, In, Sb, and Te, a metal oxide thereof, a metal sulfide thereof, and a metal nitride thereof. The metal thin film layer ranges from about 1 nm to 15 nm in thickness.

In an embodiment of the present invention, the insulating thin film layer is made of ZnS—SiOx, SiOx, SiNx, GeNx, AlNx, TiNx or AgOx or other transparent insulating dielectric materials, and is less than 4 nm in thickness.

In an embodiment of the present invention, the gain thin film layer is made of ZnO and has a thickness of 40 nm.

In an embodiment of the present invention, the transparent substrate is made of polycarbonate or epoxy resin, and a side surface of the transparent substrate is formed with a plurality of tracks.

In an embodiment of the present invention, the first transparent dielectric thin film layer is made of ZnS—SiOx, SiOx, SiNx, GeNx, AlNx, TiNx or AgOx or other transparent insulating dielectric materials, and ranges from 80 nm to 200 nm in thickness.

In an embodiment of the present invention, the second transparent dielectric thin film layer is made of ZnS—SiOx, SiOx, SiNx, GeNx, AlNx, TiNx or AgOx or other transparent insulating dielectric materials, and ranges from 10 nm to 20 nm in thickness.

In an embodiment of the present invention, the recording thin film layer is made of an alloy of Ge, Sb and Te, or an alloy of Ag, In, Sb and Te. In addition, the recording thin film layer is made of a material selected from the group consisting of Ag, Au, Cu, In, Sb, Te, Ga, As, Sn, Zn, Ce, Ge and Al, and ranges from 10 nm to 30 nm in thickness.

In an embodiment of the present invention, the near-field optical disk further comprises a reflective layer formed on the SPASER thin film layer and in contact with the SPASER thin film layer, and a protective layer formed on the reflective layer and in contact with the reflective layer. The reflective layer is made of Ag, Au, Al, Ti, Cr, Pb, tungsten (W), molybdenum (Mo), tantalum (Ta) or an alloy comprising at least one of these metals, and ranges from 100 nm to 300 nm in thickness. Further, the protective layer is made of polycarbonate or epoxy resin.

In an embodiment of the present invention, the near-field optical disk further comprises a third transparent dielectric thin film layer formed on the SPASER thin film layer and in contact with the SPASER thin film layer, and a protective layer formed on the reflective layer and in contact with the third transparent dielectric thin film layer. In addition, the third transparent dielectric thin film layer is made of ZnS—SiOx, SiOx, SiNx, GeNx, AlNx, TiNx or AgOx or other transparent insulating dielectric materials, and ranges from 20 nm and 40 nm in thickness. Furthermore, the protective layer is made of polycarbonate or epoxy resin.

The SPASER of the near-field optical disk according to the present invention is generated by a SPASER thin film layer. Therefore, after the laser beam passes through the SPASER thin film layer, the laser beam can overcome diffraction limit. Subsequently, the laser beam can write and access a smaller and high-density data pit. Consequently, the storage capacity of the optical disk can be increased without changing the wavelength of the laser beam or enlarging the numerical aperture of the lens. Because of this, the present invention not only increases significantly the storage capacity of optical disk but also decreases substantially the unnecessary cost comparing to conventional technologies for increasing the storage capacity of optical disk.

DETAILED DESCRIPTION OF THE PREFERRED EMBODIMENTS

The following specific embodiment is provided to illustrate the present invention. Others skilled in the art can readily gain an insight into other advantages and features of the present invention based on the contents disclosed in this specification. The present invention can also be performed or applied in accordance with other different embodiments. Various modifications and changes based on different viewpoints and applications yet still within the scope of the present invention can be made in the details of the specification.

Figure 1:
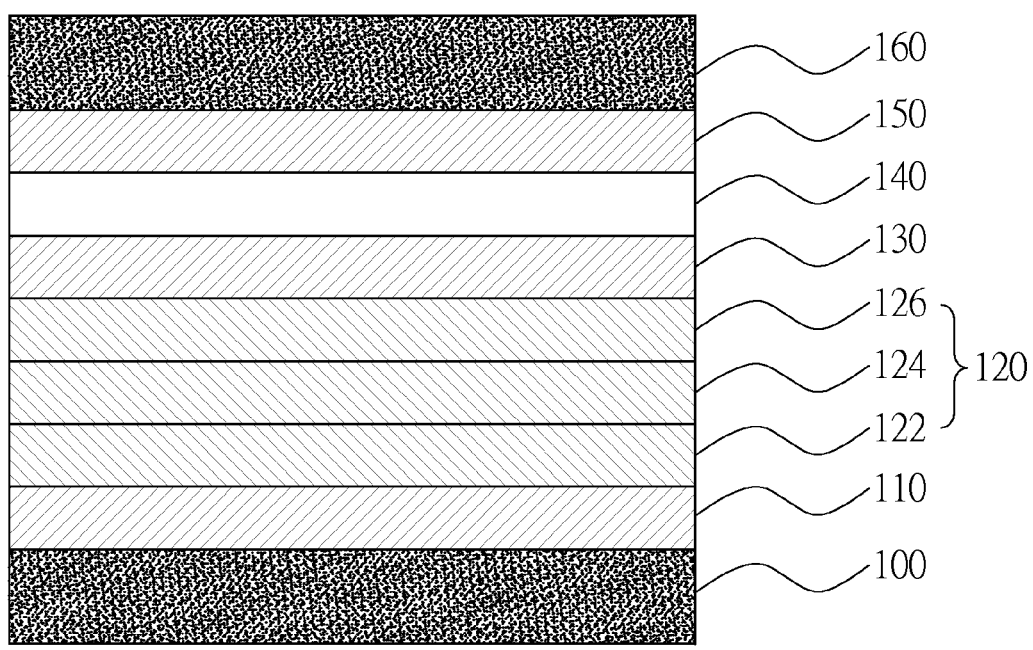
FIG. 1 is a cross-sectional view of a first embodiment according to the present invention.

Referring to FIG. 1, a cross-sectional view of the first embodiment according to the present invention is illustrated. A near-field optical disk having SPASER according to the first embodiment of the present invention includes a transparent substrate 100, a first transparent dielectric thin film layer 110 formed on the transparent substrate 100, a SPASER thin film layer 120 formed on the first transparent dielectric thin film layer 110, a second transparent dielectric thin film layer 130 formed on the SPASER thin film layer 120, a recording thin film layer 140 formed on the second transparent dielectric thin film layer 130, a third transparent dielectric thin film layer 150 formed on the recording thin film layer 140, and a protective layer 160 formed on the third transparent dielectric thin film layer 150.

In addition, a side surface of the transparent substrate 100 is formed with a plurality of concentric tracks distributed from the inside to the outside on the transparent substrate 100. Furthermore, the transparent substrate 100 is a transparent material formed by injection molding with a polymer such as polycarbonate or epoxy resin.

Moreover, the first transparent dielectric thin film layer 110 is deposited on the side surface having the tracks of the transparent substrate 100 by sputtering or other deposition methods. The first transparent dielectric thin film layer 110 can be made of ZnS—SiOx, SiOx, SiNx, GeNx, AlNx, TiNx or AgOx or other transparent insulating dielectric materials. The thickness of the first transparent dielectric thin film layer 110 is in the range of 80 nm to 200 nm.

It should be noted that the SPASER thin film layer 120 further comprises a metal thin film layer 122 formed on the first transparent dielectric thin film layer 110, an insulating thin film layer 124 formed on the metal thin film layer 122, and a gain thin film layer 126 formed on the insulating thin film layer 124. Herein, the metal thin film layer 122, the insulating thin film layer 124 and the gain thin film layer 126 are sequentially deposited on the first transparent dielectric thin film layer 110 by sputtering or other deposition methods.

The metal thin film layer 122 can be made of a metal selected from the group consisting of gold (Au), silver (Ag), platinum (Pt), palladium (Pd), tin (Sn), cadmium (Cd), lead (Pb), copper (Cu), gallium (Ga), germanium (Ge), arsenic (As), selenium (Se), indium (In), antimony (Sb), and tellurium (Te), a metal oxide thereof, a metal sulfide thereof, and a metal nitride thereof. The thickness of the metal thin film layer 122 is in the range of 1 nm to 15 nm, and a laser beam can penetrate through within the range of the thickness. The insulating thin film layer 124 can be made of zinc sulfide-silicon oxide (ZnS—SiOx), silicon oxide (SiOx), silicon nitride (SiNx), germanium nitride (GeNx), aluminum nitride (AlNx), titanium nitride (TiNx) or silver oxide (AgOx) or other transparent insulating dielectric materials. Furthermore, when the thickness of the insulating thin film layer 124 is less than 4 nm, the SPASER, which is generated by irradiating the metal thin film layer 122 and the gain thin film layer 126 with a laser beam, will not be blocked by the insulating thin film layer 124. The gain thin film layer 126 can be made of ZnO with a thickness of 40 nm.

The second transparent dielectric thin film layer 130 is deposited on the gain thin film layer 126 by sputtering or other deposition methods. The second transparent dielectric thin film layer 130 can be made of ZnS—SiOx, SiOx, SiNx, GeNx, AlNx, TiNx or AgOx or other transparent insulating dielectric materials. In addition, the thickness of the second transparent dielectric thin film layer 130 is in the range of 10 nm to 20 nm.

The recording thin film layer 140 is deposited on the second transparent dielectric thin film layer 130 by sputtering or other deposition methods. The recording thin film layer 140 can be made of an alloy of Ge, Sb and Te, or an alloy of Ag, In, Sb and Te. In addition, the recording thin film layer 140 also can be selected from the group consisting of Ag, Au, Cu, In, Sb, Te, Ga, As, Sn, Zn, Ce, Ge and Al. The thickness of the recording thin film layer 140 is in the range of 10 nm to 30 nm.

The third transparent dielectric thin film layer 150 is deposited on the recording thin film layer 140 by sputtering or other deposition methods. The third transparent dielectric thin film layer 150 can be made of zinc sulfide-silicon oxide ZnS—SiOx, SiOx, SiNx, GeNx, AlNx, TiNx or AgOx or other transparent insulating dielectric materials. In addition, the thickness of the third transparent dielectric thin film layer 150 is between 20 nm and 40 nm. The third transparent dielectric thin film layer 150 is for blocking the recording thin film layer 140 and the protective layer 160 so that the third transparent dielectric thin film layer 150 can avoid a possible damage that the protective layer 160 deposits on the recording thin film layer 140 when the protective layer 160 is deposited.

Further, the formation of the protective layer 160 is first coating an adhesive layer on the third transparent dielectric thin film layer 150 by spin coating, and then the protective layer 160 is coated on the third transparent dielectric thin film layer 150 having the adhesive layer. The protective layer 160 is for protecting the recording thin film layer 140 from being easily damaged. The protective layer 160 can be made of polycarbonate or epoxy resin.

Although the first embodiment discloses the materials and the deposition methods of the transparent substrate 100, the first transparent dielectric thin film layer 110, the SPASER thin film layer 120, the second transparent dielectric thin film layer 130, the recording thin film layer 140, the third transparent dielectric thin film layer 150 and the protective layer 160, the aforesaid description is not intended to limit the present invention. Those of ordinary skill in the art also can adopt various materials and deposition methods depending on the requirements of various designs and manufacturing processes.

Figure 2:
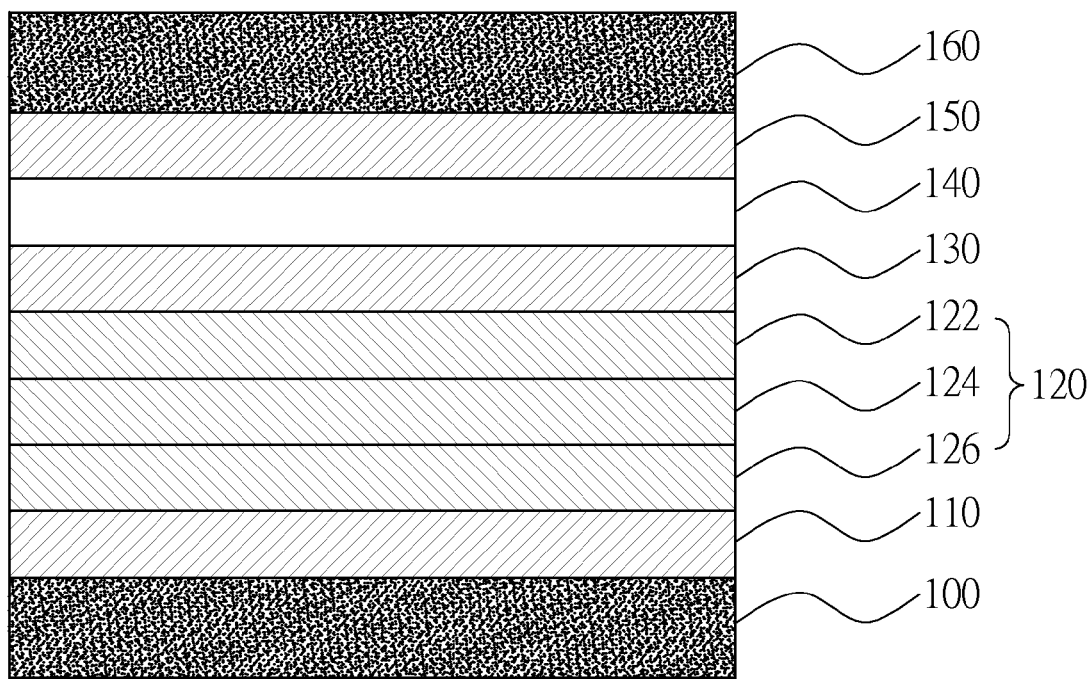
FIG. 2 is a cross-sectional view of a second embodiment according to the present invention.

Referring to FIG. 2, according to the present invention, a cross-sectional view of the second embodiment is illustrated. The exemplary materials and formation of the second embodiment and that of the first embodiment are substantially the same, and only the differences will be explained in the following paragraph.

A near-field optical disk having SPASER according to the second embodiment of the present invention includes a transparent substrate 100, a first transparent dielectric thin film layer 110 formed on the transparent substrate 100, a SPASER thin film layer 120 formed on the first transparent dielectric thin film layer 110, a second transparent dielectric thin film layer 130 formed on the SPASER thin film layer 120, a recording thin film layer 140 formed on the second transparent dielectric thin film layer 130, a third transparent dielectric thin film layer 150 formed on the recording thin film layer 140, and a protective layer 160 formed on the third transparent dielectric thin film layer 150.

It should be noted that the SPASER thin film layer 120 further comprises a gain thin film layer 126 formed on the first transparent dielectric thin film layer 110, an insulating thin film layer 124 formed on the gain thin film layer 126, and a metal thin film layer 122 formed on the insulating thin film layer 124. In addition, the gain thin film layer 126, the insulating thin film layer 124 and the metal thin film layer 122 are sequentially deposited on the first transparent dielectric thin film layer 110 by sputtering or other deposition methods.

Figure 3:
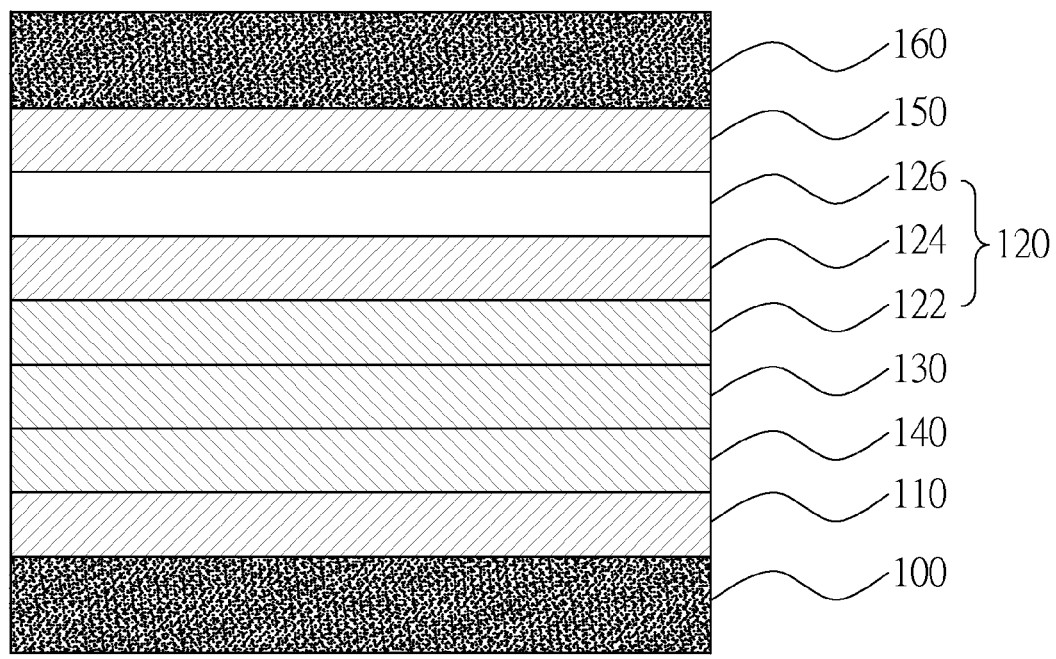
FIG. 3 is a cross-sectional view of a third embodiment according to the present invention.

Referring to FIG. 3, a cross-sectional view of the third embodiment according to the present invention is illustrated. A near-field optical disk having SPASER includes a transparent substrate 100, a first transparent dielectric thin film layer 110 formed on the transparent substrate 100, a recording thin film layer 140 formed on the first transparent dielectric thin film layer 110, a second transparent dielectric thin film layer 130 formed on the recording thin film layer 140, a SPASER thin film layer 120 formed on the second transparent dielectric thin film layer 130, a third transparent dielectric thin film layer 150 formed on the SPASER thin film layer 120, and a protective layer 160 formed on the third transparent dielectric thin film layer 150.

A side surface of the transparent substrate 100 is formed with a plurality of concentric tracks distributed from the inside to the outside on the transparent substrate 100. In addition, the transparent substrate 100 is a transparent material formed by injection molding with a polymer such as polycarbonate or epoxy resin.

Moreover, the first transparent dielectric thin film layer 110 is deposited on the side surface having the tracks of the transparent substrate 100 by sputtering or other deposition methods. The first transparent dielectric thin film layer 110 can be made of ZnS—SiOx, SiOx, SiNx, GeNx, AlNx, TiNx or AgOx or other transparent insulating dielectric materials. The thickness of the first transparent dielectric thin film layer 110 is in the range of 80 nm to 200 nm.

The recording thin film layer 140 is deposited on the first transparent dielectric thin film layer 110 by sputtering or other deposition methods. The recording thin film layer 140 can be made of an alloy of Ge, Sb and Te, or an alloy of Ag, In, Sb and Te. In addition, the recording thin film layer also can be selected from the group consisting of Ag, Au, Cu, In, Sb, Te, Ga, As, Sn, Zn, Ce, Ge and Al. The thickness of the recording thin film layer 140 is in the range of 10 nm to 30 nm.

The second transparent dielectric thin film layer 130 is deposited on the recording thin film layer 140 by sputtering or other deposition methods. The second transparent dielectric thin film layer 130 can be made of ZnS—SiOx, SiOx, SiNx, GeNx, AlNx, TiNx or AgOx or other transparent insulating dielectric materials. In addition, the thickness of the second transparent dielectric thin film layer 130 is in the range of 10 nm to 20 nm.

It should be noted that the SPASER thin film layer 120 further comprises a metal thin film layer 122 formed on the second transparent dielectric thin film layer 130, an insulating thin film layer 124 formed on the metal thin film layer 122, and a gain thin film layer 126 formed on the insulating thin film layer 124. In addition, the metal thin film layer 122, the insulating thin film layer 124 and the gain thin film layer 126 are sequentially deposited on the second transparent dielectric thin film layer 130 by sputtering or other deposition methods.

The metal thin film layer 122 can be made of a metal selected from the group consisting of Au, Ag, Pt, Pd, Sn, Cd, Pb, Cu, Ga, Ge, As, Se, In, Sb, and Te, a metal oxide thereof, a metal sulfide thereof, and a metal nitride thereof. The thickness of the metal thin film layer 122 is in the range of 1 nm to 15 nm, allowing a laser beam to penetrate through the metal thin film layer 122 of such thickness. The insulating thin film layer 124 can be made of ZnS—SiOx, SiOx, SiNx, GeNx, AlNx, TiNx or AgOx or other transparent insulating dielectric materials. Furthermore, when the thickness of the insulating thin film layer 124 is less than 4 nm, the SPASER, which is generated by irradiating the metal thin film layer 122 and the gain thin film layer 126 with a laser beam, will not be blocked by the insulating thin film layer 124. The gain thin film layer 126 can be made of zinc oxide and with a thickness of about 40 nm.

The third transparent dielectric thin film layer 150 is deposited on the SPASER thin film layer 120 by sputtering or other deposition methods. The third transparent dielectric thin film layer 150 can be made of ZnS—SiOx, SiOx, SiNx, GeNx, AlNx, TiNx or AgOx or other transparent insulating dielectric materials. In addition, the thickness of the third transparent dielectric thin film layer 150 is between 20 nm and 40 nm. The third transparent dielectric thin film layer 150 is for blocking the SPASER thin film layer 120 and the protective layer 160 so that the third transparent dielectric thin film layer 150 can prevent a possible damage that the protective layer 160 deposits on the SPASER thin film layer 120 when the protective layer 160 is deposited.

Further, the formation of the protective layer 160 is first coating an adhesive layer on the third transparent dielectric thin film layer 150 by spin coating, and then the protective layer 160 is formed on the third transparent dielectric thin film layer 150 having the adhesive layer. The protective layer 160 is for protecting the SPASER the thin film layer 120 from being easily damaged. The protective layer 160 can be made of polycarbonate or epoxy resin.

Although the third embodiment discloses the materials and the deposition methods of the transparent substrate 100, the first transparent dielectric thin film layer 110, the recording thin film layer 140, the second transparent dielectric thin film layer 130, the SPASER thin film layer 120, the third transparent dielectric thin film layer 150, and the protective layer 160, the invention is not restricted herein. Those of ordinary skill in the art also can adopt various materials and deposition methods depending on the requirements of various designs and manufacturing processes.

Figure 4:
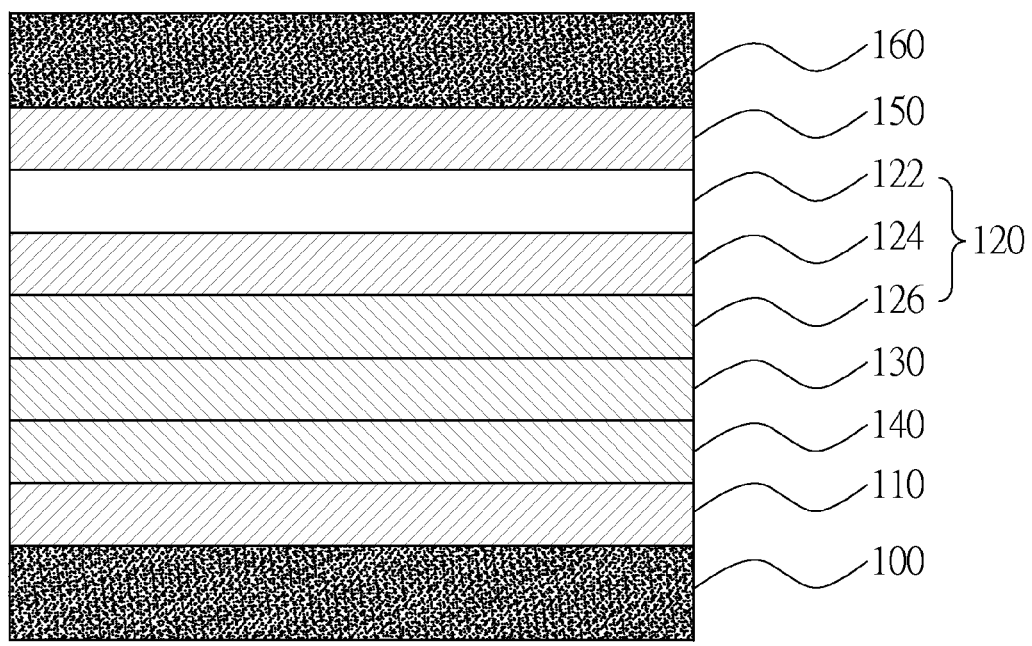
FIG. 4 is a cross-sectional view of a fourth embodiment according to the present invention.

Referring to FIG. 4, a cross-sectional view of the fourth embodiment according to the present invention is illustrated. The exemplary materials and formation of the fourth embodiment and that of the third embodiment are substantially the same, and only the differences will be explained in the following paragraph.

A near-field optical disk having SPASER according to the fourth embodiment of the present invention comprises a transparent substrate 100, a first transparent dielectric thin film layer 110 formed on the transparent substrate 100, a recording thin film layer 140 formed on the first transparent dielectric thin film layer 110, a second transparent dielectric thin film layer 130 formed on the recording thin film layer 140, a SPASER thin film layer 120 formed on the second transparent dielectric thin film layer 130, a third transparent dielectric thin film layer 150 formed on the SPASER thin film layer 120, and a protective layer 160 formed on the third transparent dielectric thin film layer 150.

It is noted that the SPASER thin film layer 120 further comprises a gain thin film layer 126 formed on the second transparent dielectric thin film layer 130, an insulating thin film layer 124 formed on the gain thin film layer 126, and a metal thin film layer 122 formed on the insulating thin film layer 124. In addition, the gain thin film layer 126, the insulating thin film layer 124 and the metal thin film layer 122 are sequentially deposited on the second transparent dielectric thin film layer 130 by sputtering or other deposition methods.

Figure 5:
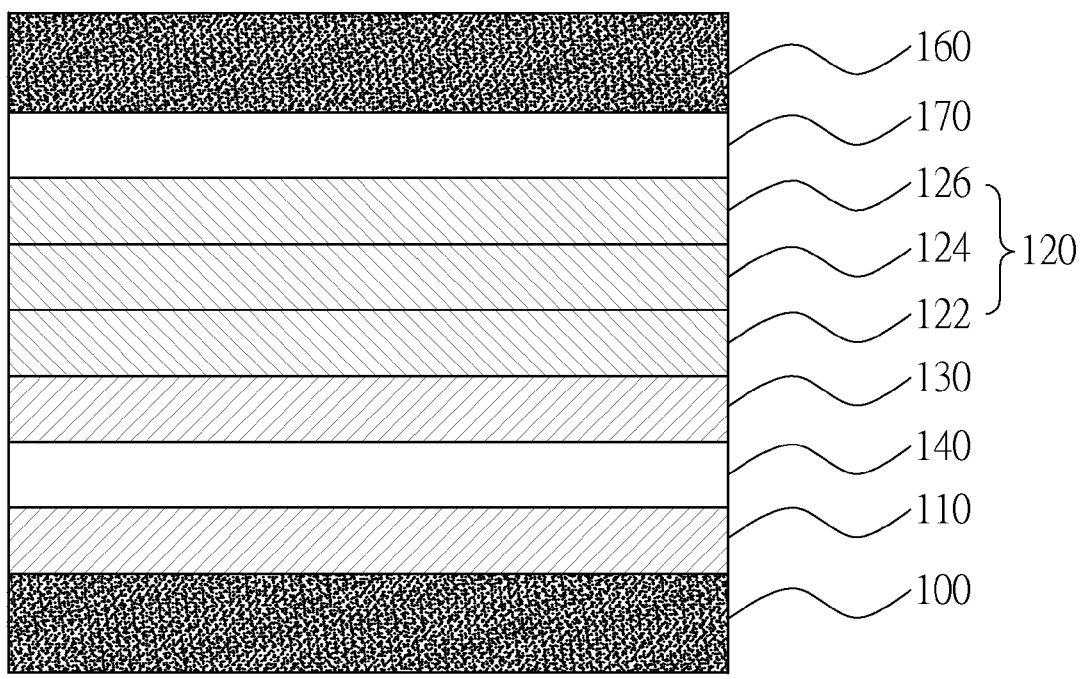
FIG. 5 is a cross-sectional view of a fifth embodiment according to the present invention.

Referring to FIG. 5, a cross-sectional view of the fifth embodiment according to the present invention is illustrated. The exemplary materials and formation of the fifth embodiment and that of the third embodiment are substantially the same, and only the differences will be explained in the following paragraph.

A near-field optical disk having SPASER according to the fifth embodiment of the present invention comprises a transparent substrate 100, a first transparent dielectric thin film layer 110 formed on the transparent substrate 100, a recording thin film layer 140 formed on the first transparent dielectric thin film layer 110, a second transparent dielectric thin film layer 130 formed on the recording thin film layer 140, a SPASER thin film layer 120 formed on the second transparent dielectric thin film layer 130, a reflective layer 170 formed on the SPASER thin film layer 120, and a protective layer 160 formed on the reflective layer 170.

The reflective layer 170 is formed on the SPASER thin film layer 120 by sputtering or other deposition methods. The reflective layer 170 can be made of a material selected from the group consisting of Ag, Au, Al, Ti, Cr, Pb, W, Mo, Ta or and an alloy comprising at least one of these metals. The thickness of the reflective layer 170 is in the range of about 100 nm to 300 nm. The reflective layer 170 is for reflecting an incident laser beam passing through the near-filed optical disk having SPASER.

Further, the formation of the protective layer 160 is first coating an adhesive layer on the reflective layer 170 by spin coating, and then the protective layer 160 is coated on the reflective layer 170 having the adhesive layer. The protective layer 160 is for protecting the near-field optical disk having SPASER from being easily damaged. In addition, the protective layer 160 can be made of polycarbonate or epoxy resin.

Although the fifth embodiment discloses the materials and the deposition methods of the transparent substrate 100, the first transparent dielectric thin film layer 110, the recording thin film layer 140, the second transparent dielectric thin film layer 130, the SPASER thin film layer 120, the reflective layer 170, and the protective layer 160, the invention is not restricted herein. Those of ordinary skill in the art also can adopt various materials and deposition methods depending on the requirements of various designs and manufacturing processes.

Figure 6:
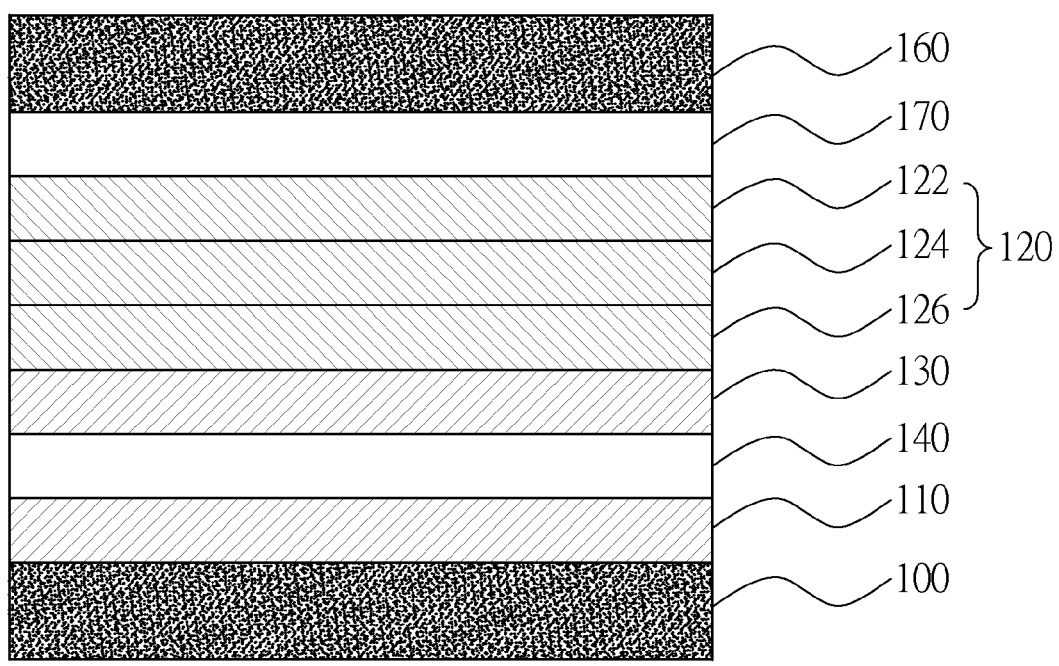
FIG. 6 is a cross-sectional view of a sixth embodiment according to the present invention.

Referring to FIG. 6, a cross-sectional view of the sixth embodiment according to the present invention is illustrated. The exemplary materials and formation of the sixth embodiment and that of the fifth embodiment are substantially the same, and only the differences will be explained in the following paragraph.

A near-field optical disk having SPASER according to the sixth embodiment of the present invention comprises a transparent substrate 100, a first transparent dielectric thin film layer 110 formed on the transparent substrate 100, a recording thin film layer 140 formed on the first transparent dielectric thin film layer 110, a second transparent dielectric thin film layer 130 formed on the recording thin film layer 140, a SPASER thin film layer 120 formed on the second transparent dielectric thin film layer 130, a reflective layer 170 formed on the SPASER thin film layer 120, and a protective layer 160 formed on the reflective layer 170.

It is noted that the SPASER thin film layer 120 further comprises a gain thin film layer 126 formed on the second transparent dielectric thin film layer 130, an insulating thin film layer 124 formed on the gain thin film layer 126, and a metal thin film layer 122 formed on the insulating thin film layer 124. In addition, the gain thin film layer 126, the insulating thin film layer 124 and the metal thin film layer 122 are sequentially deposited on the second transparent dielectric thin film layer 130 by sputtering or other deposition methods.

The SPASER of the near-field optical disk having SPASER according to the present invention is generated by a SPASER thin film layer and that the SPASER can resolve the restriction of the storage capacity of optical disks by diffraction limit. When a laser beam irradiates the gain thin film layer of the near-field optical disk having SPASER, the gain thin film layer will absorb photons of the laser beam and one or more excitonics are generated by carrier multiplication effect. Next, the excitonics of the gain thin film layer recombines and emits photons. Then, the energy of the photons will transfer to surface plasmon resonances of the metal thin film layer as a result of the increase of amount of the surface plasmon resonances. After the amount of the surface plasmon resonances increases, the gain thin film layer is further excited and the amount of the excitonics of the gain thin film layer increases. Therefore, the amount of the surface plasmon resonances as the same modal is increased by the increased amount of the excitonics of the gain thin film layer. The above operation mechanism will be continuously repeated, and then the amount of the surface plasmon resonances is increased consecutively. When the amount of surface plasmon resonances achieve a critical value, the SPASER thin film layer will emit a light beyond the diffraction limit, such that the laser beam can write and access the data pit beyond the diffraction limit on the recording thin film layer. Thus, the storage capacity of the optical disk can be increased without changing the wavelength of the laser beam or enlarging the numerical aperture of the lens. Because of it, the present invention not only increases significantly the storage capacity of optical disk but also decreases substantially the unnecessary cost comparing to conventional technologies for increasing the storage capacity of optical disk. The related technologies and researches of the present invention can refer to the following papers which authored by Mark I. Stockman et al. See, e.g., David J. Bergman and Mark I. Stockman, *Surface Plasmon Amplification by Stimulated Emission of Radiation: Quantum Generation of Coherent Surface Plasmons in Nanosystems*, Phys. Rev. Lett. 90, 027402 (2003); and Mark I. Stockman, *Surface Plasmon Amplification by Stimulated Emission of Radiation as explained*, Nat. Phot. 2, 327 (2008); and Mark I. Stockman, *Surface Plasmon Amplification by Stimulated Emission of Radiation as Nanoscale Quantum Generator and Ultrafast Amplifier*, J. Opt. 12 024004 (2010).

The foregoing descriptions of the detailed embodiments are only to disclose the features and functions of the present invention and do not intend to limit the scope of the present invention. It should be understood to those in the art that all modifications and variations according to the spirit and principle of the present invention should fall within the scope of the appended claims.

What is claimed is:

1. A near-field optical disk having surface plasmon amplification by stimulated emission of radiation (SPASER), comprising:
    a transparent substrate;
    a first transparent dielectric thin film layer formed on the transparent substrate;
    a SPASER thin film layer formed on the first transparent dielectric thin film layer;
    a second transparent dielectric thin film layer formed on the SPASER thin film layer;
    a recording thin film layer formed on the second transparent dielectric thin film layer; and
    a third transparent dielectric thin film layer formed on the recording thin film layer,
    wherein the SPASER thin film layer comprises:
        a metal thin film layer in contact with the first transparent dielectric thin film layer;
        an insulating thin film layer formed on the metal thin film layer; and
        a gain thin film layer formed on the insulating thin film layer and in contact with the second transparent dielectric thin film layer.

2. The near-field optical disk of claim 1, wherein the metal thin film layer is made of a material selected from the group consisting of gold (Au), silver (Ag), platinum (Pt), palladium (Pd), tin (Sn), cadmium (Cd), lead (Pb), copper (Cu), gallium (Ga), germanium (Ge), arsenic (As), selenium (Se), indium (In), antimony (Sb), and tellurium (Te), a metal oxide thereof, a metal sulfide thereof, and a metal nitride thereof.

3. The near-field optical disk of claim 1, wherein the metal thin film layer ranges from 1 nm to 15 nm in thickness.

4. The near-field optical disk of claim 1, wherein the insulating thin film layer is made of a material selected from the group consisting of zinc sulfide-silicon oxide ($ZnS—SiO_x$), silicon oxide ($SiO_x$), silicon nitride ($SiN_x$), germanium nitride ($GeN_x$), aluminum nitride ($AlN_x$), titanium nitride ($TiN_x$), and silver oxide ($AgO_x$).

5. The near-field optical disk of claim 1, wherein the insulating thin film layer is less than 4 nm in thickness.

6. The near-field optical disk of claim 1, wherein the gain thin film layer is made of zinc oxide (ZnO).

7. The near-field optical disk of claim 1, wherein the gain thin film layer is about 40 nm thick.

8. The near-field optical disk of claim 1, wherein the SPASER thin film layer comprises:
  a gain thin film layer in contact with the first transparent dielectric thin film layer;
  an insulating thin film layer formed on the gain thin film layer; and
  a metal thin film layer formed on the insulating thin film layer and in contact with the second transparent dielectric thin film layer.

9. The near-field optical disk of claim 8, wherein the metal thin film layer is made of a material selected from the group consisting of gold (Au), silver (Ag), platinum (Pt), palladium (Pd), tin (Sn), cadmium (Cd), lead (Pb), copper (Cu), gallium (Ga), germanium (Ge), arsenic (As), selenium (Se), indium (In), antimony (Sb), and tellurium (Te), a metal oxide thereof, a metal sulfide thereof, and a metal nitride thereof.

10. The near-field optical disk of claim 8, wherein the metal thin film layer ranges from 1 nm to 15 nm in thickness.

11. The near-field optical disk of claim 1, further comprising a protective layer formed on the third transparent dielectric thin film layer and in contact with the third transparent dielectric thin film layer.

12. A near-field optical disk having surface plasmon amplification by stimulated emission of radiation (SPASER), comprising:
  a transparent substrate;
  a first transparent dielectric thin film layer formed on the transparent substrate;
  a recording thin film layer formed on the first transparent dielectric thin film layer;
  a second transparent dielectric thin film layer formed on the recording thin film layer; and
  a SPASER thin film layer formed on the second transparent dielectric thin film layer, wherein the SPASER thin film layer comprises:
    a metal thin film layer in contact with the second transparent dielectric thin film layer;
    an insulating thin film layer formed on the metal thin film layer; and
    a gain thin film layer formed on the insulating thin film layer.

13. The near-field optical disk of claim 12, wherein the metal thin film layer is made of a material selected from the group consisting of gold (Au), silver (Ag), platinum (Pt), palladium (Pd), tin (Sn), cadmium (Cd), lead (Pb), copper (Cu), gallium (Ga), germanium (Ge), arsenic (As), selenium (Se), indium (In), antimony (Sb), and tellurium (Te), a metal oxide thereof, a metal sulfide thereof, and a metal nitride thereof.

14. The near-field optical disk of claim 12, wherein the metal thin film layer ranges from 1 nm to 15 nm in thickness.

15. The near-field optical disk of claim 12, wherein the insulating thin film layer is made of a material selected from the group consisting of zinc sulfide-silicon oxide ($ZnS—SiO_x$), silicon oxide ($SiO_x$), silicon nitride ($SiN_x$), germanium nitride ($GeN_x$), aluminum nitride ($AlN_x$), titanium nitride ($TiN_x$) and silver oxide ($AgO_x$).

16. The near-field optical disk of claim 12, wherein the recording thin film layer ranges from 10 nm to 30 nm in thickness.

17. The near-field optical disk of claim 12, further comprising a reflective layer formed on the SPASER thin film layer and in contact with the SPASER thin film layer.

18. The near-field optical disk of claim 17, wherein the reflective layer is made of a material selected from the group consisting of Ag, Au, Al, Ti, Cr, Pb, tungsten (W), molybdenum (Mo), tantalum (Ta) and an alloy comprising at least one of these metals.

* * * * *